United States Patent
Cho et al.

(10) Patent No.: US 11,417,772 B2
(45) Date of Patent: Aug. 16, 2022

(54) SEMICONDUCTOR DEVICE

(71) Applicant: SAMSUNG ELECTRONICS CO., LTD., Suwon-si (KR)

(72) Inventors: Min Hee Cho, Suwon-si (KR); Woo Bin Song, Hwaseong-si (KR); Hyun Mog Park, Seoul (KR); Min Woo Song, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/778,114

(22) Filed: Jan. 31, 2020

(65) Prior Publication Data

US 2021/0020781 A1 Jan. 21, 2021

(30) Foreign Application Priority Data

Jul. 16, 2019 (KR) .................. 10-2019-0085443

(51) Int. Cl.
*H01L 29/786* (2006.01)
*H01L 29/417* (2006.01)
*H01L 29/04* (2006.01)
*H01L 29/45* (2006.01)

(52) U.S. Cl.
CPC ........ *H01L 29/7869* (2013.01); *H01L 29/045* (2013.01); *H01L 29/41775* (2013.01); *H01L 29/45* (2013.01)

(58) Field of Classification Search
CPC ............... H01L 27/105; H01L 27/1214; H01L 29/7869; H01L 29/41766
See application file for complete search history.

(56) References Cited

U.S. PATENT DOCUMENTS

| | | | |
|---|---|---|---|
| 7,372,070 B2 * | 5/2008 | Yatsunami | H01L 51/105 257/E51.011 |
| 8,367,489 B2 | 2/2013 | Yamazaki | |
| 8,436,350 B2 | 5/2013 | Yamazaki et al. | |
| 8,470,650 B2 | 6/2013 | Akimoto et al. | |
| 8,507,916 B2 | 8/2013 | Misaki | |
| 8,618,543 B2 * | 12/2013 | Lee | H01L 21/02554 257/E29.049 |
| 8,629,069 B2 | 1/2014 | Akimoto et al. | |
| 8,703,531 B2 | 4/2014 | Honda et al. | |
| 8,728,883 B2 | 5/2014 | Yamazaki et al. | |

(Continued)

FOREIGN PATENT DOCUMENTS

| | | | | |
|---|---|---|---|---|
| CN | 104979380 A | * | 10/2015 | ......... H01L 29/7869 |
| JP | 2006-165528 A | | 6/2006 | |

(Continued)

OTHER PUBLICATIONS

CN-104979380-A machine translation (Year: 2015).*
Shin et al. "The Mobility Enhancement of Indium Gallium Zinc Oxide, etc . . . " Scientific Reports, 7:10885, 2017.

*Primary Examiner* — Vincent Wall
(74) *Attorney, Agent, or Firm* — Lee IP Law, P.C.

(57) ABSTRACT

A semiconductor device includes a substrate, an oxide semiconductor film on the substrate, a first gate structure on the oxide semiconductor film and a contact that is in contact with the oxide semiconductor film, the contact being disposed on a boundary surface with the oxide semiconductor film, and including a metal oxide film that includes a transition metal.

11 Claims, 12 Drawing Sheets

(56) References Cited

U.S. PATENT DOCUMENTS

| | | | |
|---|---|---|---|
| 8,766,329 B2 | 7/2014 | Endo et al. | |
| 8,772,768 B2* | 7/2014 | Yamazaki | H01L 29/0847 257/51 |
| 8,809,852 B2 | 8/2014 | Yamazaki et al. | |
| 8,846,460 B2 | 9/2014 | Sasaki et al. | |
| 8,987,728 B2 | 3/2015 | Honda et al. | |
| 9,029,863 B2* | 5/2015 | Isobe | H01L 27/1259 257/296 |
| 9,082,857 B2 | 7/2015 | Yamazaki et al. | |
| 9,099,562 B2 | 8/2015 | Akimoto et al. | |
| 9,331,207 B2 | 5/2016 | Yamazaki et al. | |
| 9,337,344 B2* | 5/2016 | Hanaoka | H01L 29/41733 |
| 9,590,109 B2* | 3/2017 | Miyairi | H01L 29/785 |
| 9,705,001 B2* | 7/2017 | Yamazaki | H01L 29/78696 |
| 9,722,049 B2 | 8/2017 | Lee et al. | |
| 9,837,551 B2* | 12/2017 | Hondo | H01L 29/7869 |
| 9,947,796 B2 | 4/2018 | Liu | |
| 9,991,286 B2 | 6/2018 | Koyama et al. | |
| 10,050,152 B2* | 8/2018 | Yamazaki | H01L 27/1255 |
| 2009/0134399 A1* | 5/2009 | Sakakura | H01L 51/0011 313/504 |
| 2011/0101351 A1* | 5/2011 | Yamazaki | H01L 21/46 257/E27.113 |
| 2013/0161606 A1* | 6/2013 | Isobe | H01L 29/0603 257/43 |
| 2013/0181214 A1* | 7/2013 | Yamazaki | H01L 29/78696 257/43 |
| 2014/0175423 A1 | 6/2014 | Jeong et al. | |
| 2014/0332800 A1* | 11/2014 | Hanaoka | H01L 29/7869 257/43 |
| 2015/0091003 A1* | 4/2015 | Kurokawa | H01L 29/7869 257/43 |
| 2015/0108470 A1* | 4/2015 | Yamazaki | H01L 27/1225 257/43 |
| 2015/0123121 A1* | 5/2015 | Hanaoka | H01L 29/78603 257/43 |
| 2015/0171222 A1* | 6/2015 | Sasagawa | H01L 29/24 257/43 |
| 2015/0187814 A1* | 7/2015 | Miyairi | H01L 27/1225 257/43 |
| 2015/0325701 A1* | 11/2015 | Noda | H01L 29/78648 257/43 |
| 2016/0056043 A1* | 2/2016 | Tanaka | H01L 29/7869 438/585 |
| 2016/0064444 A1* | 3/2016 | Inoue | H01L 27/14614 257/43 |
| 2017/0323976 A1* | 11/2017 | Yamazaki | H01L 29/7869 |
| 2020/0044095 A1* | 2/2020 | Wang | H01L 29/66969 |
| 2020/0357923 A1* | 11/2020 | Yamazaki | H01L 29/78696 |
| 2020/0365706 A1* | 11/2020 | Lee | H01L 21/02603 |
| 2020/0388679 A1* | 12/2020 | Song | H01L 29/7869 |
| 2021/0091080 A1* | 3/2021 | Dewey | H01L 21/823821 |

FOREIGN PATENT DOCUMENTS

| | | |
|---|---|---|
| KR | 10-2010-0079310 A | 7/2010 |
| KR | 10-2011-0025334 A | 3/2011 |
| KR | 10-2016-0121942 A | 10/2016 |
| KR | 10-2018-0020916 A | 2/2018 |

\* cited by examiner

SEMICONDUCTOR DEVICE

CROSS-REFERENCE TO RELATED APPLICATION

Korean Patent Application No. 10-2019-0085443, filed on Jul. 16, 2019, in the Korean Intellectual Property Office, and entitled: "Semiconductor Device," is incorporated by reference herein in its entirety.

BACKGROUND

1. Field

Embodiments relate to a semiconductor device.

2. Description of the Related Art

As a silicon film used as a semiconductor film of a transistor, an amorphous silicon film or a polycrystalline silicon film may be used depending on the purpose. For example, in the case of a transistor included in a large display device, an amorphous silicon film in which characteristics may be formed relatively uniformly even when formed to have a large area may be used. On the other hand, in the case of an element including a driving circuit or the like, a polycrystalline silicon film that may exhibit high electric field-effect mobility may be used. As a method for forming the polycrystalline silicon film, a method of heat-treating an amorphous silicon film at a high temperature or a method of treating the amorphous silicon film with a laser beam may be used.

SUMMARY

Embodiments are directed to a semiconductor device, including a substrate, an oxide semiconductor film on the substrate, a first gate structure on the oxide semiconductor film and a contact that is in contact with the oxide semiconductor film, the contact being disposed on a boundary surface with the oxide semiconductor film, and including a metal oxide film that includes a transition metal.

Embodiments are also directed to a semiconductor device, including a substrate, a gate structure on the substrate, an oxide semiconductor film including a contact trench formed on at least one side of the gate structure between the substrate and the gate structure, and a contact that fills the contact trench, extends along a side wall of the gate structure, and includes a transition metal. The contact may include a contact liner extending along the side wall of the gate structure, and a contact filling film that fills a liner recess defined by the contact liner, and a portion of the contact may be in contact with the oxide semiconductor film.

Embodiments are also directed to a semiconductor device, including a substrate, an oxide semiconductor film including an amorphous region and a polycrystalline region on the substrate, a trench in the oxide semiconductor film, a gate electrode that fills a portion of the trench, a storage plug on at least one side of the gate electrode and connected to the oxide semiconductor film, and an information storage pattern connected to the storage plug.

BRIEF DESCRIPTION OF THE DRAWINGS

Features will become apparent to those of skill in the art by describing in detail example embodiments with reference to the attached drawings in which.

DETAILED DESCRIPTION

In drawings of a semiconductor device according to some example embodiments, although a planar transistor is exemplarily shown, a semiconductor device according to example embodiments may include a fin-type transistor (FinFET) including a fin-type pattern-shaped channel region, a transistor including a nano-wire, a transistor including a nano-sheet, or a three-dimensional (3D) transistor. Also, the semiconductor device according to some example embodiments may include a bipolar junction transistor, a lateral double diffusion transistor (LDMOS), and the like.

Figure 1:
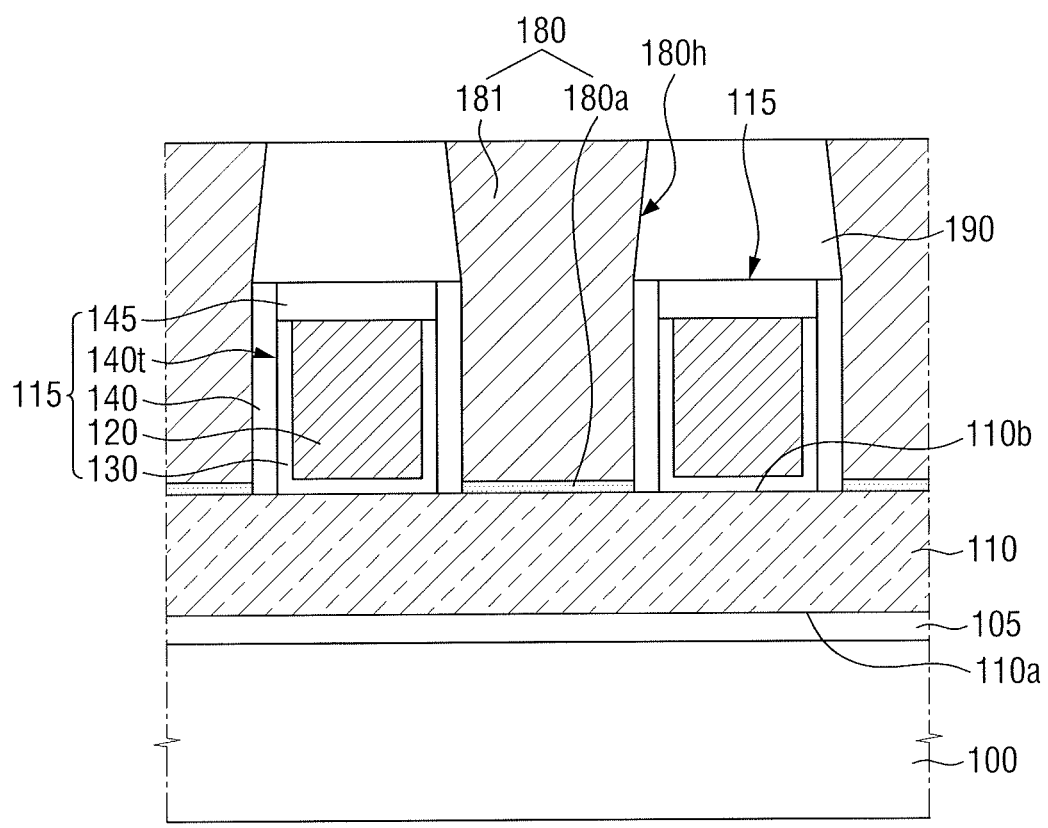
FIG. 1 illustrates a diagram of a semiconductor device according to an example embodiment.

FIG. 1 is a diagram of a semiconductor device according to an example embodiment.

Referring to FIG. 1, a semiconductor device according to an example embodiment may include a substrate 100, a first oxide semiconductor film 110, a first gate structure 115, and a first contact 180.

The substrate 100 may be a bulk silicon or a SOI (silicon-on-insulator). In another example embodiment, the substrate 100 may be a silicon substrate, or may include other materials, for example, silicon germanium, SOI (silicon germanium-on-insulator), indium antimonide, lead tellurium compounds, indium arsenide, phosphide indium, gallium arsenide, or gallium antimonide. In another example embodiment, the substrate 100 may include a glass substrate, a ceramic substrate, or a quartz substrate, and may include an organic substrate having heat resistance sufficient to withstand heat treatment in a semiconductor manufacturing process.

The first oxide semiconductor film 110 may be disposed on the substrate 100. The first oxide semiconductor film 110 may be formed of a semiconducting material. The first oxide semiconductor film 110 may be used as a channel region of a transistor. Thus, the first oxide semiconductor film 110 may be a channel layer of the transistor. The first oxide semiconductor film 110 may have semiconductor characteristics. The first oxide semiconductor film 110 may be, for example, a metal oxide semiconductor film.

The first oxide semiconductor film 110 may include a first surface 110a and a second surface 110b facing away from each other. In the present example embodiment, the first surface 110a of the first oxide semiconductor film 110 is opposite to the substrate 100.

The first oxide semiconductor film 110 may be a polycrystalline metal oxide film. For example, the first oxide semiconductor film 110 may include a C-axis aligned crystal (CAAC). The first oxide semiconductor film 110 may be a quasi-crystalline material formed or crystallized using a transition metal of a source/drain region.

The first oxide semiconductor film 110 may include, for example, one of indium oxide, tin oxide, zinc oxide, In—Zn-based oxide (IZO), Sn—Zn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Sn-based oxide (ITO), In—Ga—Sn-based oxide (IGTO), In—Al—Zn-based oxide, In—Sn—Zn-based oxide, Sn—Ga—Zn-based oxide, Al—Ga—Zn—based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, In—Hf—Al—Zn—based oxide, and Ba—Sn-based oxide.

Here, the In—Ga—Zn-based oxide means an oxide containing In, Ga, and Zn as main components, but does not indicate a ratio of In, Ga, and Zn. Further, the In—Ga—Zn—based oxide may include doped metal elements or dopants other than In, Ga, and Zn, for example, to form source/drain regions in portions thereof.

As an example, the first oxide semiconductor film 110 may be one of an In—Ga—based oxide, an In—Zn-based oxide, an In—Sn-based oxide, an In—Ga—Sn-based oxide, or an In—Ga-based oxide, and may be, for example, an In—Ga—Zn-based oxide.

The buffer insulating film 105 may be disposed on the substrate 100. The buffer insulating film 105 may extend along an upper surface of the substrate 100.

The buffer insulating film 105 may be disposed between the substrate 100 and the first oxide semiconductor film 110. The buffer insulating film 105 may be disposed between the upper surface of the substrate 100 and the first surface 110a of the first oxide semiconductor film 100.

The buffer insulating film 105 may be an insulating film that prevents or suppresses impurity elements such as hydrogen, water, hydroxyl (—OH), or the like from being diffused into the first oxide semiconductor film 110 from the substrate 100.

The buffer insulating film 105 may include one of a silicon oxide film, a silicon oxynitride film, a silicon nitride film, an aluminum oxide film, an aluminum oxynitride film, and a combination thereof.

The plurality of first gate structures 115 may be disposed on the first oxide semiconductor film 110. The plurality of first gate structures 115 may be disposed on the second surface 110b of the first oxide semiconductor film 110.

The plurality of first gate structures 115 may be spaced apart from each other. The first gate structures 115 spaced apart from each other may be disposed with the first contact 180 interposed therebetween. The first oxide semiconductor film 110 may be disposed between each first gate structure 115 and the substrate 100.

Each first gate structure 115 may include a first gate electrode 120, a first insulating material film 130, a gate spacer 140, and a capping pattern 145.

The gate spacer 140 may be disposed on the first oxide semiconductor film 110. The gate spacer 140 is shown to be formed as a single film or as multiple films.

The gate spacer 140 may be formed of an insulating material. The gate spacer 140 may include, for example, at least one of silicon nitride (SiN), silicon oxynitride (SiON), silicon oxide (SiO$_2$), silicon oxycarbonitride (SiOCN), silicon boron nitride (SiBN), silicon oxyboron nitride (SiOBN), silicon oxycarbide (SiOC), and combinations thereof.

In an example embodiment, the gate spacer 140 may serve as a guide for forming a self-aligned contact, and the gate spacer 140 may include a material having an etching selectivity with respect to a first interlayer insulating film 190 to be described below.

The gate trench 140t may be defined by a gate spacer 140. In the gate trench 140t, for example, the gate spacer 140 may be used as a side wall of the trench, and the second surface 110b of the first oxide semiconductor film 110 may be used as a bottom surface of the trench.

The first insulating material film 130 may be, for example, a gate dielectric film. The first insulating material film 130 may be disposed on the first oxide semiconductor film 110. The first insulating material film 130 may be in contact with the first oxide semiconductor film 110. The first insulating material film 130 may be formed along the side wall and the bottom surface of the gate trench 140t. The first insulating material film 130 may be used as, for example, a gate insulating film.

The first insulating material film 130 may include, for example, at least one of silicon oxide, silicon oxynitride, silicon nitride, or a high-dielectric constant material having a dielectric constant higher than that of silicon oxide.

The high-dielectric constant material may include, for example, one or more of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The first insulating material film 130 may be a single film or may include, for example, a combination of an interface insulating material film formed at an interface with the first oxide semiconductor film 110 and a high-dielectric constant insulating material film.

The first gate electrode 120 may be disposed on the first insulating material film 130. The first gate electrode 120 may be disposed between the gate spacers 140. The first gate electrode 120 may fill a portion of the gate trench 140t.

The first gate electrode 120 may be formed of a conductive material. The first gate electrode 120 may include, for example, at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V), impurity-doped polysilicon, impurity-doped polysilicon germanium, and combinations thereof. The first gate electrode 120 may include a conductive metal oxide, a conductive metal oxynitride, or the like, and may include a form in which the above-described material is oxidized.

The first gate electrode 120 may be formed, for example, through a replacement process (or a gate-last process).

The capping pattern 145 may be disposed on the first gate electrode 120. The capping pattern 145 may fill a portion of the gate trench 140t that remains after the first gate electrode 120 and the first insulating material film 130 are formed. Although the first insulating material film 130 is shown not to be formed between the gate spacer 140 and the capping pattern 145, the first insulating material film 130 may be formed between the gate spacer 140 and the first gate electrode 120, and between the first oxide semiconductor film 110 and the first gate electrode 120. Specifically, the first insulating material film 130 may extend along the second surface 110b of the first oxide semiconductor film 110.

Although the capping pattern 145 is shown to be formed between the inner side walls of the gate spacer 140 in FIG. 1, the upper surface of the gate spacer 140 may also be recessed in a direction of the substrate 100 (like the first gate electrode 120), in which case the capping pattern 145 may be formed on the upper surface of the gate spacer 140 and the upper surface of the first gate electrode 120.

The capping pattern 145 may include, for example, a material having an etching selectivity with respect to the first interlayer insulating film 190. The capping pattern 145 may include, for example, at least one of silicon nitride (SiN), silicon oxynitride (SiON), silicon oxide (SiO$_2$), silicon carbonitride (SiCN), silicon oxycarbonitride (SiOCN), and combinations thereof.

In an example embodiment, the first gate structure 115 may not include the capping pattern 145. Thus, for example, the upper surface of the gate spacer 140 and the upper surface of the first gate electrode 120 may be located on the same plane.

The first interlayer insulating film 190 may be disposed on the first oxide semiconductor film 110. The first interlayer insulating film 190 may cover the first gate structure 115.

The first interlayer insulating film 190 may include a first contact hole 180h that exposes at least a portion of the first oxide semiconductor film 110. The first contact hole 180h may expose at least a portion of the first oxide semiconductor film 110 located between the adjacent first gate structures 115.

In the semiconductor device according to the present example embodiment, a bottom surface of the first contact hole 180h may be defined by the first oxide semiconductor film 110.

In the semiconductor device according to the present example embodiment, a portion of the side wall of the first contact hole 180h may be defined by the first gate structure 115. In another example embodiment, the side wall of the first contact hole 180h may be defined by the first interlayer insulating film 190, that is, a portion of the first interlayer insulating film 190 may be interposed between the first contact 180 and the first gate structure 115.

The first interlayer insulating film 190 may include, for example, at least one of silicon oxide, silicon nitride, silicon oxynitride, and a low-dielectric constant material. The low-dielectric constant material may include, for example, FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, a porous polymeric material, or a combination thereof.

The first interlayer insulating film 190 may be a single layer or may include a plurality of layers.

The first contact 180 may fill the first contact hole 180h. The first contact 180 may be connected to the first oxide semiconductor film 110. The first contact 180 may be in contact with the first oxide semiconductor film 110.

The first contact 180 may be disposed on the second surface 110b of the first oxide semiconductor film 110. The first contact 180 may include a portion that extends along a side wall of the first gate structure 115.

Each of the first contact 180 and the first gate structure 115 may extend in a direction away from the substrate 100, on the basis of the first oxide semiconductor film 110. In another example embodiment, each of the first contact 180 and the first gate structure 115 may also extend in a direction toward the substrate 100 on the basis of the first oxide semiconductor film 110, depending on the structure of the transistor to be formed.

In the semiconductor device according to the present example embodiment, the first gate structure 115 and the first contact 180 may be disposed on the second surface 110b of the first oxide semiconductor film 110. Thus, when one side and the other side facing each other around the first oxide semiconductor film 110 are defined, the first gate structure 115 and the first contact 180 may be disposed on one side of the first oxide semiconductor film 110.

The first contact 180 may include a first contact stud 181 and a first contact oxide film 180a.

The first contact oxide film 180a may be disposed at a boundary surface between the first contact 180 and the first oxide semiconductor film 110. The first contact oxide film 180a may be disposed between the first contact stud 181 and the first oxide semiconductor film 110.

The first contact oxide film 180a may be formed along the first oxide semiconductor film 110 exposed by the first contact hole 180h. The first contact 180 may include the first contact oxide film 180a and the first contact stud 181 sequentially disposed on the first oxide semiconductor film 110.

The first contact stud 181 may be formed of a conductive metal. The first contact 180 may include a transition metal. For example, the first contact stud 181 may include a transition metal. The first contact oxide film 180a may include a metal oxide including a transition metal included in the first contact stud 181.

The first contact stud 181 may include, for example, at least one of tantalum (Ta), titanium (Ti), and molybdenum (Mo). As an example, when the first contact stud 181 includes tantalum (Ta), the first contact oxide film 180a may include a metal oxide including tantalum (Ta).

Figure 2:
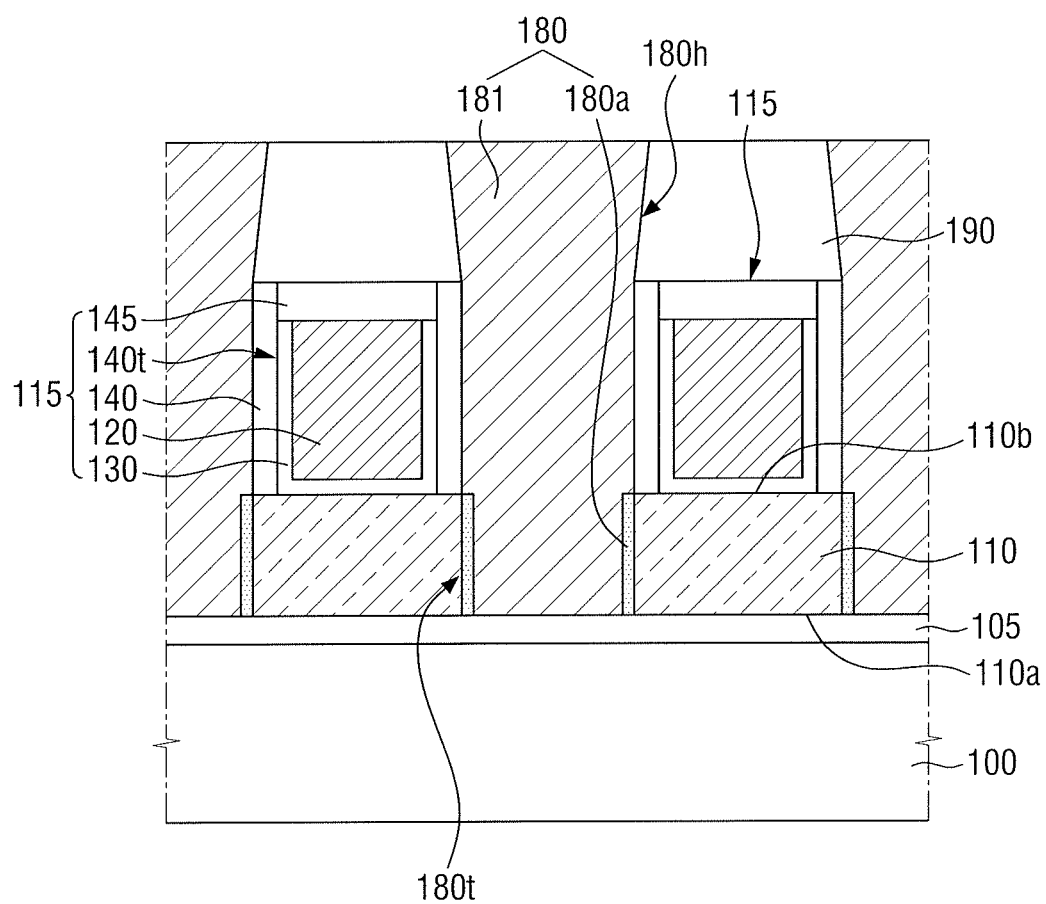
FIG. 2 illustrates a diagram of a semiconductor device according to an example embodiment.

FIG. 2 is a diagram of a semiconductor device according to an example embodiment. For the convenience of explanation, differences from those explained using FIG. 1 will be mainly described.

Referring to FIG. 2, in the semiconductor device according to the present example embodiment, the first oxide semiconductor film 110 may include a contact trench 180t formed on at least one side of the first gate structure 115.

The contact trench 180*t* may be connected to the first contact hole 180*h*. The first contact hole 180*h* may be aligned with a side wall of the contact trench 180*t*. In an implementation (not shown), the contact trench 180*t* may expand to the lower portion of the first gate structure 115.

The contact trench 180*t* may expose the buffer insulating film 105. In an implementation (not shown), the contact trench 180*t* may be formed in the first oxide semiconductor film 110, and may not expose the buffer insulating film 105. The side wall of the contact trench 180*t* may be defined by the first oxide semiconductor film 110.

In the present example embodiment, a portion of the first contact 180 is disposed in the contact trench 180*t*. The first contact 180 may fill the contact trench 180*t*.

In the present example embodiment, the contact trench 180*t* is disposed at the boundary surface between the first oxide semiconductor film 110 and the first contact 180. Thus, the first contact oxide film 180*a* may be formed along the side wall of the contact trench 180*t*.

In the manufacturing process for forming the contact trench 180*t*, if the contact trench 180*t* does not expose the buffer insulating film 105 (not shown), a portion of the first contact oxide film 180*a* may include a portion extending above the upper surface of the buffer insulating film 105.

Figure 3:
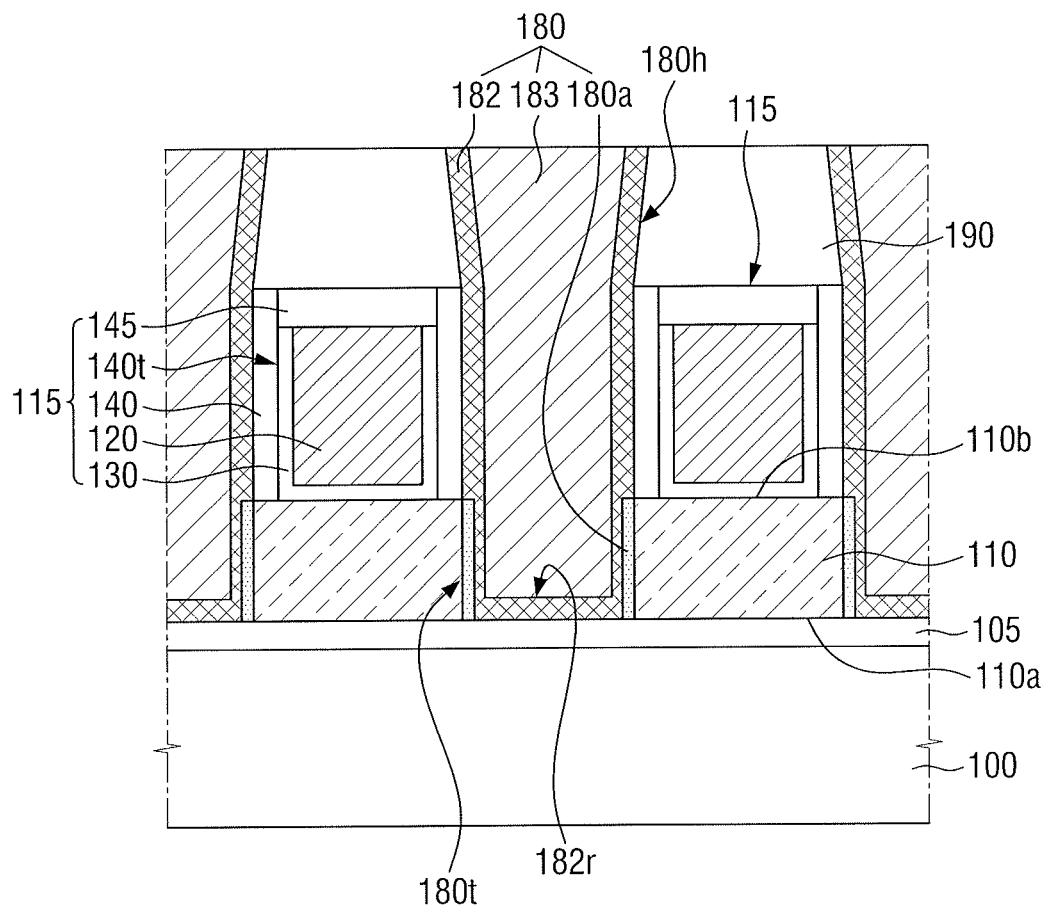
FIG. 3 illustrates a diagram of a semiconductor device according to an example embodiment.

FIG. 3 is a diagram of a semiconductor device according to an example embodiment. For the convenience of explanation, differences from those explained using FIG. 2 will be mainly explained.

Referring to FIG. 3, in the semiconductor device according to the present example embodiment, the first contact 180 may include a first contact liner 182 and a first contact filling film 183.

The first contact liner 182 may extend along the side wall and the bottom surface of the contact trench 180*t* and the first contact hole 180*h*. In the present example embodiment, the first contact liner 182 includes a portion that extends along the side wall of the first gate structure 115.

A first liner recess 182*r* extending along the side wall of the first gate structure 115 may be defined by the first contact liner 182. In the present example embodiment, the first liner recess 182*r* includes a portion extending along the first oxide semiconductor film 110.

The first contact filling film 183 may be disposed on the first contact liner 182. The first contact filling film 183 may fill the portions of the contact trench 180*t* and the first contact hole 180*h* that remain after the first contact liner 182 is formed. The first contact filling film 183 may fill the first liner recess 182*r*.

The first contact liner 182 may include a transition metal. The first contact liner 182 may include, for example, at least one of tantalum (Ta), titanium (Ti), and molybdenum (Mo).

The first contact filling film 183 may include a metal having a resistance value lower than that of the transition metal included in the first contact liner 182. The first contact filling film 183 may include a low-resistance metal. The first contact filling film 183 may include, for example, at least one of tungsten (W), aluminum (Al), copper (Cu), cobalt (Co), ruthenium (Ru), rhodium (Rh), silver (Ag), gold (Au), platinum (Pt), and combinations thereof.

The first contact oxide film 180*a* may be disposed at the boundary surface between the first contact liner 182 and the first oxide semiconductor film 110. The first contact oxide film 180*a* may include a metal oxide including a transition metal included in the first contact liner 182.

A portion of the first contact liner 182 may be interposed between the first contact oxide film 180*a* and the first contact filling film 183.

Figure 4:
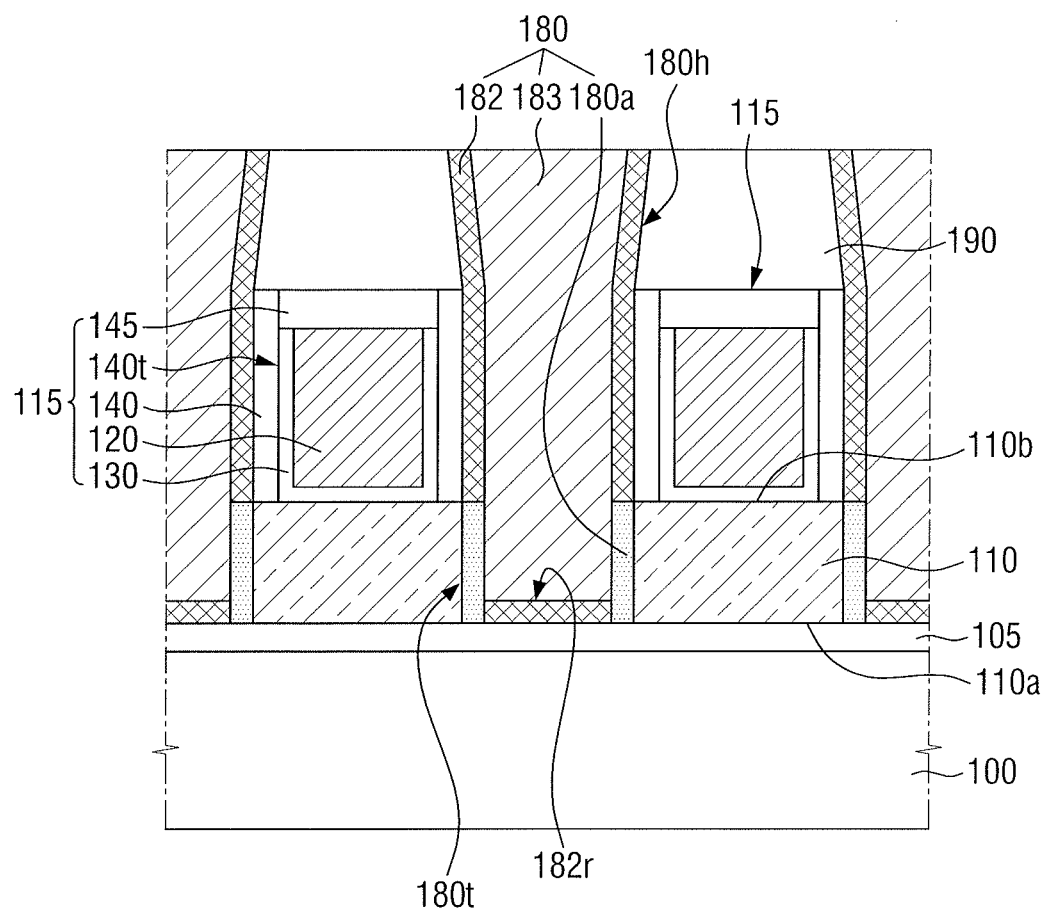
FIG. 4 illustrates a diagram of a semiconductor device according to an example embodiment.

FIG. 4 is a diagram of a semiconductor device according to an example embodiment. For convenience of explanation, differences from those explained using FIG. 3 will be mainly explained.

Referring to FIG. 4, in the semiconductor device according to the present example embodiment, the first contact oxide film 180*a* may be in contact with the first contact filling film 183.

The first liner recess 182*r* may be defined by the first contact liner 182 and the first contact oxide film 180*a*.

The portion of the first contact liner 182 disposed on the bottom surface of the contact trench 180*t* and the portion of the first contact liner 182 extending along the side wall of the first gate structure 115 may be connected to each other by the first contact oxide film 180*a*.

Figure 5:
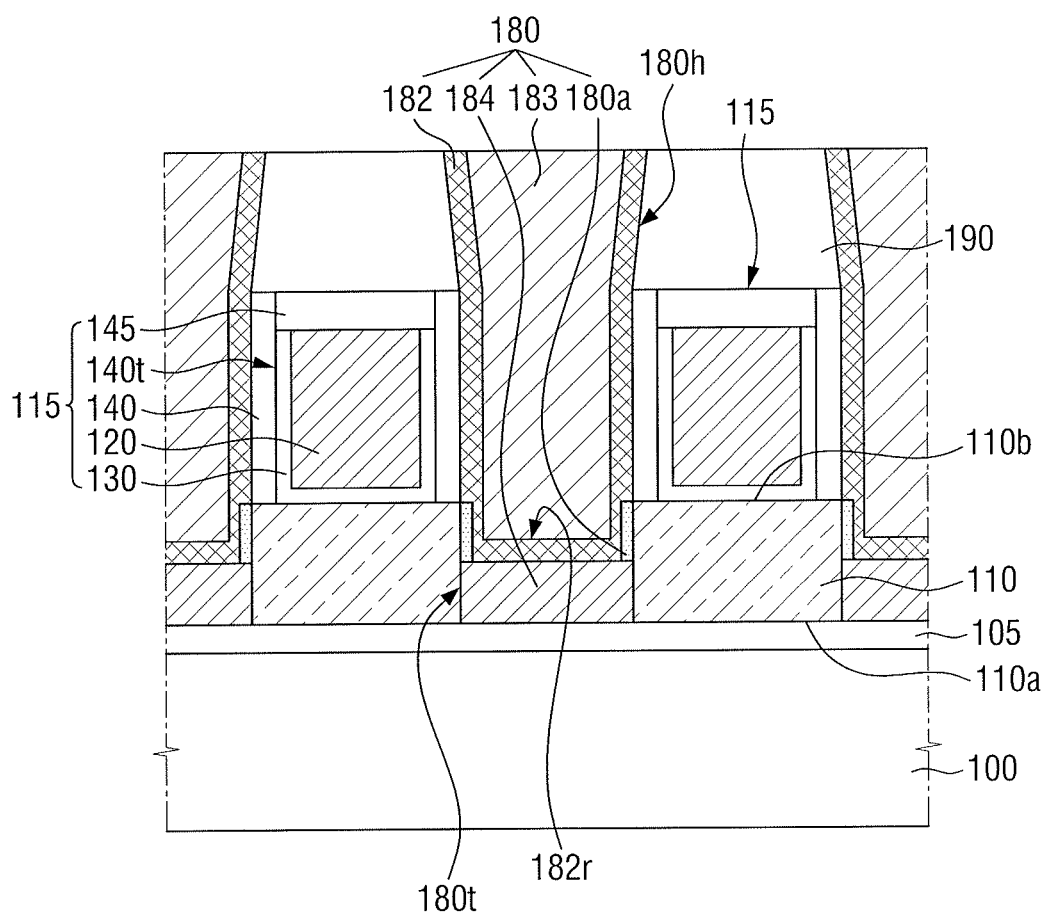
FIG. 5 illustrates a diagram of a semiconductor device according to an example embodiment.

FIG. 5 is a diagram of a semiconductor device according to an example embodiment. For convenience of explanation, differences from those explained using FIG. 3 will be mainly explained.

Referring to FIG. 5, in the semiconductor device according to the present example embodiment, the first contact 180 may further include a lower contact stud 184.

The lower contact stud 184 may fill a portion of the contact trench 180*t*, and may have a height such that a portion of the first oxide semiconductor film 110 defining the side wall of the contact trench 180*t* is not in contact with (and thus extends above) the lower contact stud 184.

In the present example embodiment, the upper surface of the lower contact stud 184 is closer to the buffer insulating film 105 (and thus lower than) than the second surface 110*b* of the first oxide semiconductor film 110.

The lower contact stud 184 may include a metal having a lower resistance value than that of the transition metal included in the first contact liner 182. The lower contact stud 184 may include, for example, at least one of tungsten (W), aluminum (Al), copper (Cu), cobalt (Co), ruthenium (Ru), rhodium (Rh), silver (Ag), gold (Au), platinum (Pt) and combinations thereof.

The first contact liner 182 may extend along the side walls of the first gate structure 115 and the upper surface of the lower contact stud 184.

The boundary surface between the first contact 180 and the first oxide semiconductor film 110 may include a first portion covered with the lower contact stud 184, and a second portion not covered with the lower contact stud 184. The first contact oxide film 180*a* may be disposed in the second portion of the boundary surface between the first contact 180 and the first oxide semiconductor film 110.

Figure 6:
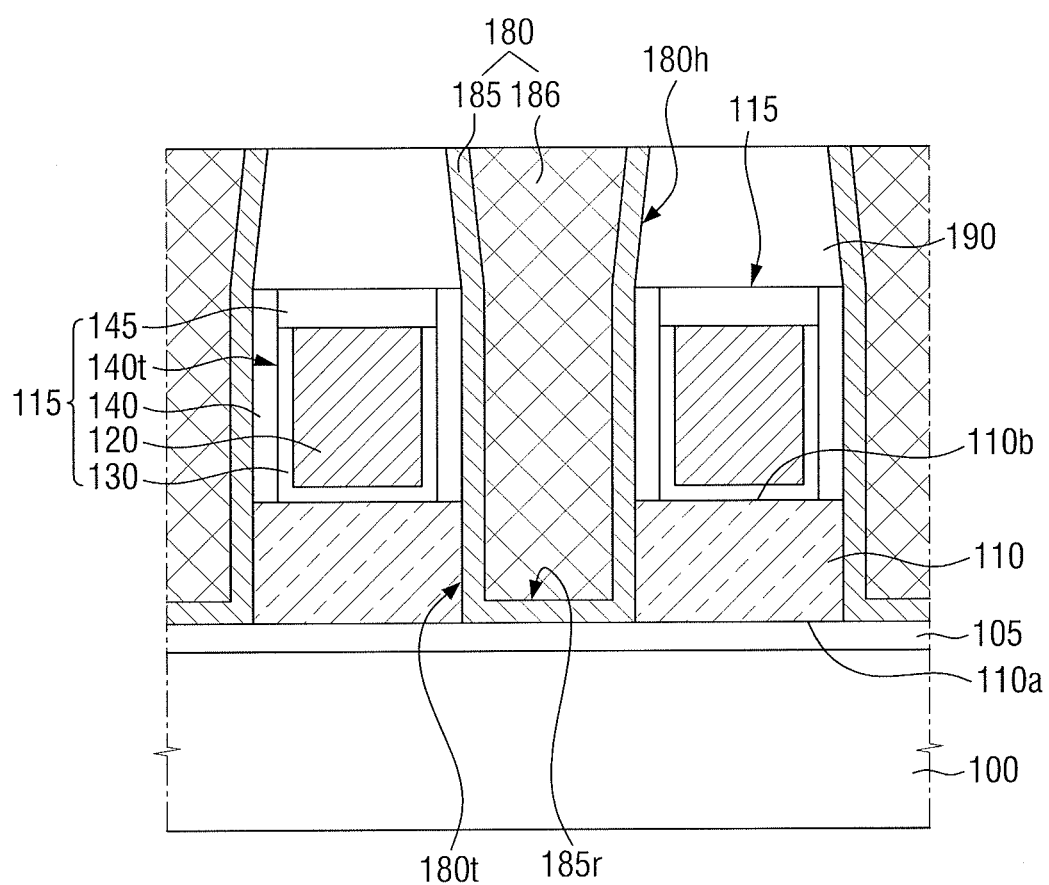
FIG. 6 illustrates a diagram of a semiconductor device according to an example embodiment.

FIG. 6 is a diagram of a semiconductor device according to an example embodiment. For the convenience of explanation, differences from those explained using FIG. 2 will be mainly explained.

Referring to FIG. 6, in the semiconductor device according to an example embodiment, the first contact 180 may include a second contact liner 185 and a second contact filling film 186.

The second contact liner 185 may extend along the side wall and the bottom surface of the contact trench 180*t* and the first contact hole 180*h*. In the present example embodiment, the second contact liner 185 includes a portion that extends along the side walls of the first gate structure 115.

A second liner recess 185*r* extending along the side walls of the first gate structure 115 may be defined by the second contact liner 185. In the present example embodiment, the second liner recess 185*r* includes a portion extending along the first oxide semiconductor film 110.

The second contact filling film 186 may be disposed on the second contact liner 185. The second contact filling film 186 may fill a portion of the contact trench 180t and a portion of the first contact hole 180h that remain after the second contact liner 185 is formed. The second contact filling film 186 may fill the second liner recess 185r.

The second contact liner 185 may include a conductive metal oxide. The second contact liner 185 may be used as a path for electrons moving between the second contact filling film 186 and the first oxide semiconductor film 110.

The second contact liner 185 may include, for example, one of zinc oxide (ZnO) and indium tin oxide (ITO).

The second contact filling film 186 may include a transition metal. The second contact filling film 186 may include, for example, at least one of tantalum (Ta), titanium (Ti), and molybdenum (Mo).

In the present example embodiment, the first contact oxide film (180a of FIG. 2) may not be formed between the second contact liner 185 and the first oxide semiconductor film 110. In addition, the first contact oxide film (180a of FIG. 2) may not be formed between the second contact filling film 186 and the second contact liner 185.

Figure 7:
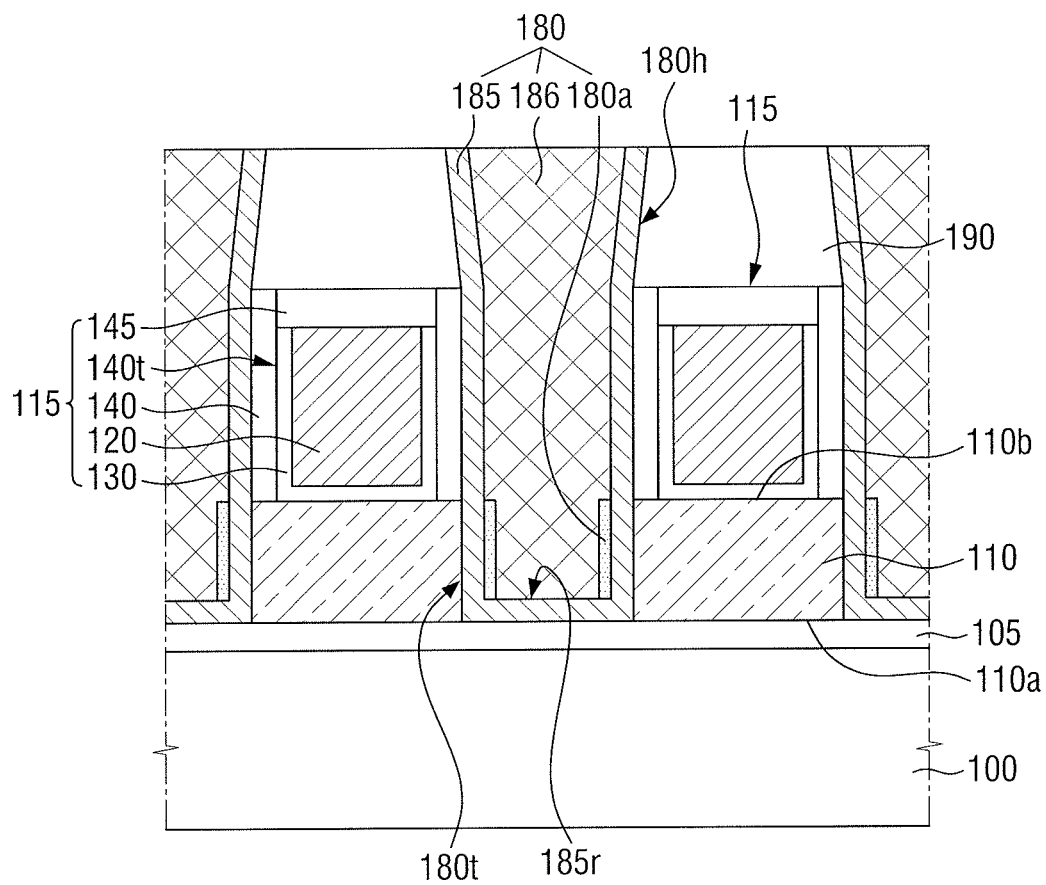
FIG. 7 illustrates a diagram of a semiconductor device according to an example embodiment.

FIG. 7 is a diagram of a semiconductor device according to an example embodiment. For the convenience of explanation, differences from those explained using FIG. 1 will be mainly explained.

Referring to FIG. 7, in the semiconductor device according to the present example embodiment, the first contact oxide film 180a may be disposed between the second contact filling film 186 and the second contact liner 185.

The first contact oxide film 180a may extend along a portion of the second liner recess 185r. For example, the first contact oxide film 180a may be formed where the first oxide semiconductor film 110 and the second contact filling film 186 overlap each other in a side view.

The first contact oxide film 180a may include a metal oxide containing a transition metal included in the second contact filling film 186.

Figure 8:
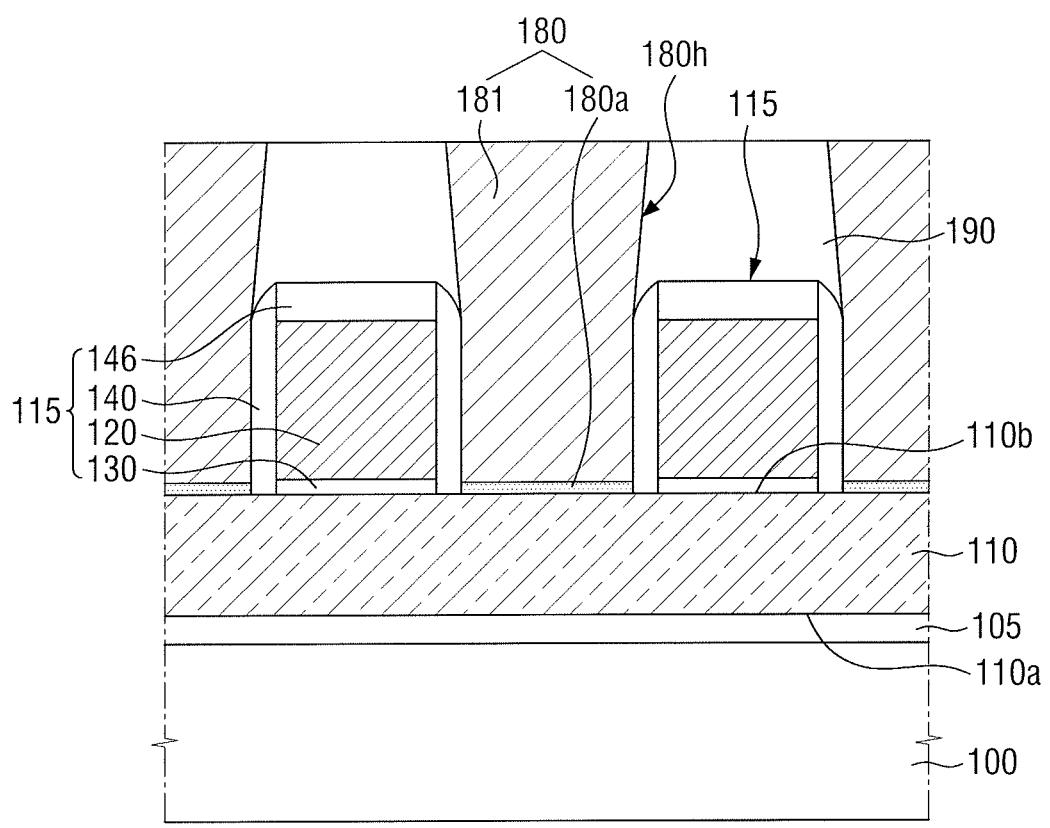
FIG. 8 illustrates a diagram of a semiconductor device according to an example embodiment.

FIG. 8 is a diagram of a semiconductor device according to an example embodiment. For the convenience of explanation, differences from those explained using FIG. 1 will be mainly explained.

Referring to FIG. 8, in the semiconductor device according to the present example embodiment, the first gate structure 115 may include a first gate electrode 120, a first insulating material film 130, a gate spacer 140 and a blocking insulating film 146.

The first insulating material film 130, the first gate electrode 120, and the blocking insulating film 146 may overlap on the first oxide semiconductor film 110 in a plate shape.

In the present example embodiment, the first insulating material film 130 does not extend between the side wall of the first gate electrode 120 and the inner side wall of the gate spacer 140.

The blocking insulating film 146 may include, for example, at least one of silicon oxide, silicon oxynitride, and silicon nitride.

Figure 9:
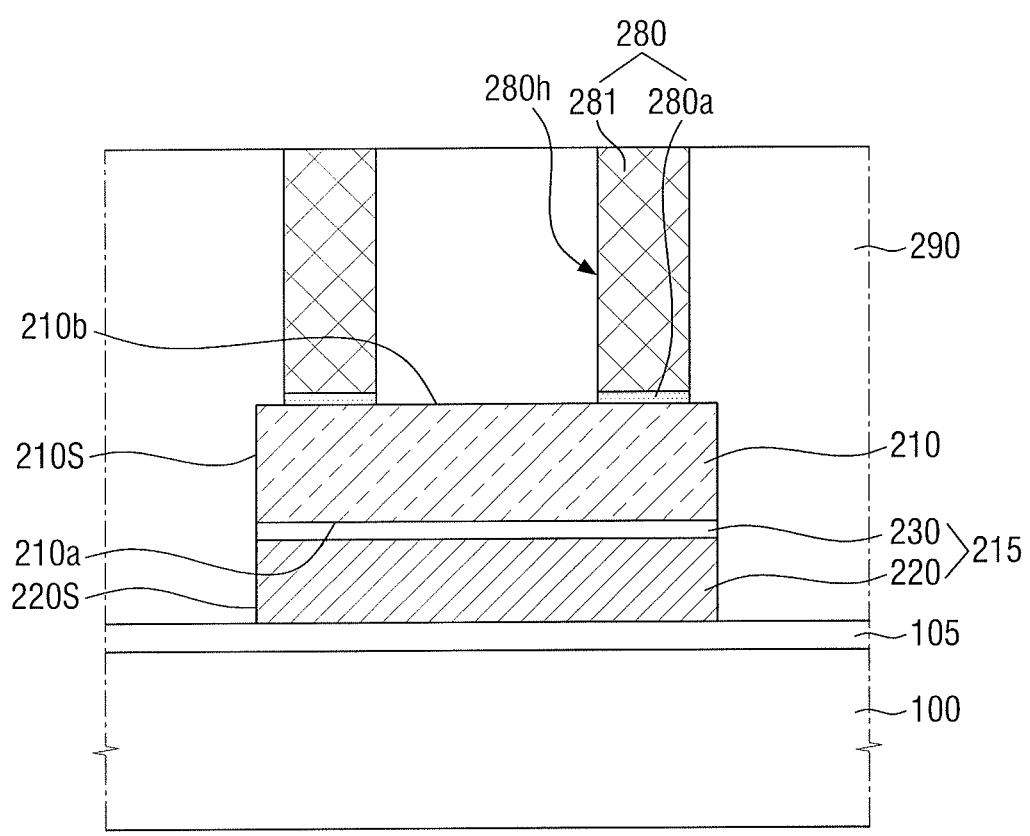
FIG. 9 illustrates a diagram of a semiconductor device according to an example embodiment.

FIG. 9 is a diagram of a semiconductor device according to an example embodiment.

For reference, repeated parts of those explained using FIGS. 1 to 8 will be briefly explained or omitted.

Referring to FIG. 9, a semiconductor device according to the present example embodiment may include the substrate 100, a second oxide semiconductor film 210, a second gate structure 215, and a second contact 280.

The second oxide semiconductor film 210 may be disposed on the substrate 100. The second oxide semiconductor film 210 may include a first surface 210a and a second surface 210b facing away from each other. The first surface 210a of the second oxide semiconductor film 210 faces the substrate 100.

The second oxide semiconductor film 210 may include a side wall 210S that connects the first surface 210a and the second surface 210b of the second oxide semiconductor film 210.

The second gate structure 215 may be disposed on the second oxide semiconductor film 210. The second gate structure 215 may be disposed on the first surface 210a of the second oxide semiconductor film 210.

The second gate structure 215 may be disposed between the second oxide semiconductor film 210 and the substrate 100. The second gate structure 215 may include a second gate electrode 220 and a second insulating material film 230 sequentially stacked on the substrate 100. The second insulating material film 230 may be used as, for example, a gate insulating film.

The second gate electrode 220 may include a side wall 220S extending between the second insulating material film 230 and the substrate 100. The side wall 220S of the second gate electrode 220 connects one surface of the second gate electrode 220 facing the second oxide semiconductor film 210 and the other opposite of the second gate electrode 220 facing the substrate 100.

In the present example embodiment, the second insulating material film 230 is not formed on the side wall 220S of the second gate electrode 220, and the second insulating material film 230 does not extend along the side wall 220S of the second gate electrode 220.

In the semiconductor device according to an example embodiment, the side wall 220S of the second gate electrode 220 and the side wall 210S of the second oxide semiconductor film 210 may be aligned in a thickness direction of the substrate 100

The second interlayer insulating film 290 may be disposed on the second oxide semiconductor film 210. The second interlayer insulating film 290 may cover the second gate structure 215.

The second interlayer insulating film 290 may include a second contact hole 280h that exposes a portion of the second oxide semiconductor film 210.

The second interlayer insulating film 290 may include, for example, at least one of silicon oxide, silicon nitride, silicon oxynitride, and a low-dielectric constant material.

The second contact 280 may fill the second contact hole 280h. The second contact 280 may be connected to the second oxide semiconductor film 210. The second contact 280 may be in contact with the second oxide semiconductor film 210.

The second contact 280 may be disposed on the second surface 210b of the second oxide semiconductor film 210. The second oxide semiconductor film 210 may be disposed between the second contact 280 and the second gate structure 215.

With respect to one side and an opposite side facing each other around the second oxide semiconductor film 210, the second gate structure 215 may be disposed on the one side and the second contact 280 may be disposed on the opposite side of the second oxide semiconductor film 210.

The second contact 280 may include a second contact stud 281 and a second contact oxide film 280a.

The second contact oxide film 280a may be disposed at a boundary surface between the second contact 280 and the second oxide semiconductor film 210. The second contact oxide film 280a may be disposed between the second contact stud 281 and the second oxide semiconductor film 210.

The second contact oxide film 280a may be formed along the second oxide semiconductor film 210 exposed by the second contact hole 280h. The second contact 280 may include a second contact oxide film 280a and a second contact stud 281 sequentially disposed on the second oxide semiconductor film 210.

The second contact 280 may include a transition metal. For example, the second contact stud 281 may include a transition metal. The second contact oxide film 280a may include a metal oxide including a transition metal included in the second contact stud 281.

The second contact stud 281 may include, for example, at least one of tantalum (Ta), titanium (Ti), and molybdenum (Mo).

Figure 10:
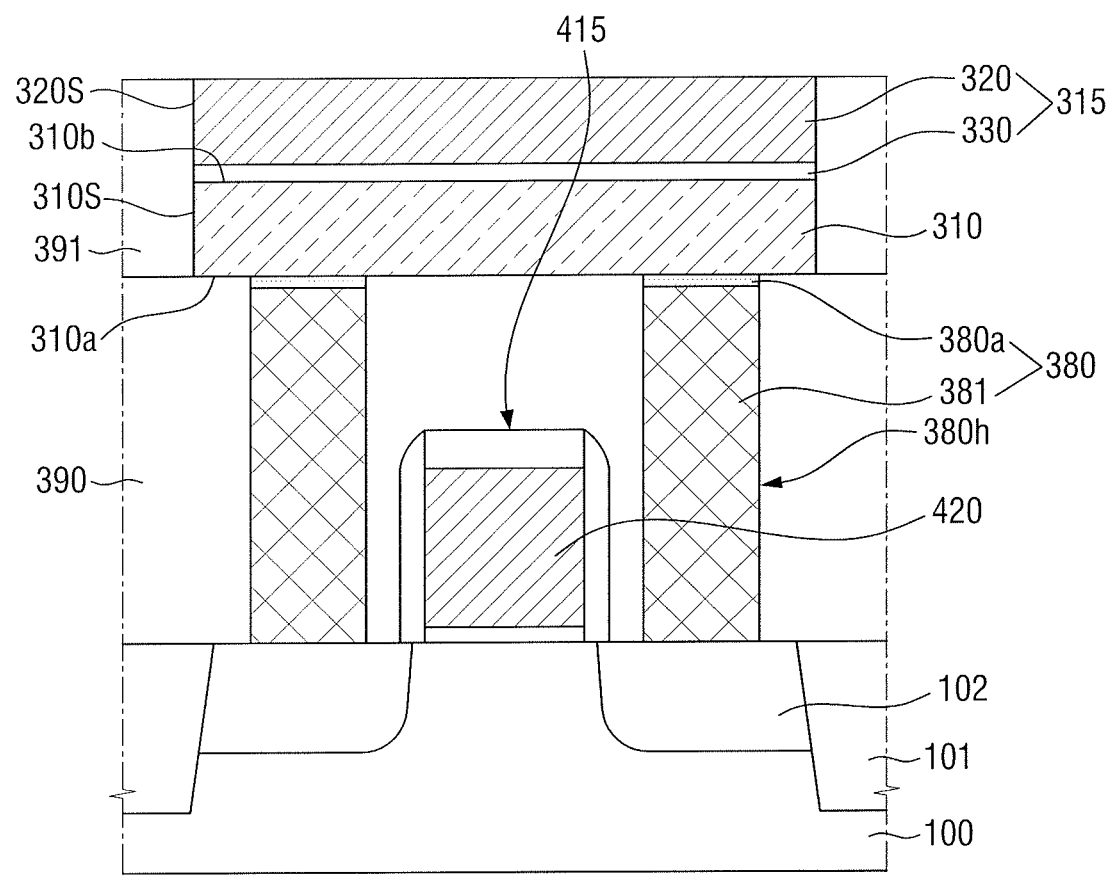
FIG. 10 illustrates a diagram of a semiconductor device according to an example embodiment.

FIG. 10 is a diagram for explaining the semiconductor device according to an example embodiment. For the convenience of explanation, differences from those explained using FIG. 1 will be mainly explained.

For reference, positional relationships between a third oxide semiconductor film 310, a third gate structure 315, and a third contact 380 described below are the same as the positional relationships between the second oxide semiconductor film 210, the second gate structure 215, and the second contact 280 described above.

Referring to FIG. 10, the semiconductor device according to the present example embodiment may include the substrate 100, the third oxide semiconductor film 310, the third gate structure 315, the third contact 380, a fourth gate structure 415.

A first element isolation film 101 may be formed in the substrate 100. The first element isolation film 101 may define an active region in the substrate 100.

A transistor including a fourth gate structure 415 and a source/drain region 102 may be formed on the substrate 100.

The fourth gate structure 415 may be disposed on the substrate 100. The fourth gate structure 415 may be disposed on the active region defined by the first element isolation film 101.

The fourth gate structure 415 may include a fourth gate electrode 420. The source/drain region 102 may be disposed on at least one side of the fourth gate structure 415.

The third lower interlayer insulating film 391 may be disposed on the substrate 100. The third lower interlayer insulating film 391 may cover the fourth gate structure 415 and the source/drain region 102.

The third lower interlayer insulating film 391 may include a third contact hole 380h that exposes at least a portion of the source/drain region 102. In an implementation (not shown), the third contact hole 380h may expose a portion of the fourth gate electrode 420.

The third oxide semiconductor film 310 may be disposed on the third lower interlayer insulating film 391. The third oxide semiconductor film 310 may include a first surface 310a and a second surface 310b. The first surface 310a of the third oxide semiconductor film 310 may face the third lower interlayer insulating film 391. The first surface 310a of the third oxide semiconductor film 310 may face the substrate 100.

The third oxide semiconductor film 310 may include a side wall 310S of the third oxide semiconductor that connects the first surface 310a and the second surface 310b of the third oxide semiconductor film 310.

In the semiconductor device according to an example embodiment, the transistor including the fourth gate structure 415 may be disposed between the third oxide semiconductor film 310 and the substrate 100.

The third gate structure 315 may be disposed on the third oxide semiconductor film 310. The third gate structure 315 may be disposed on the second surface 310b of the third oxide semiconductor film 310.

The third oxide semiconductor film 310 may be disposed between the third gate structure 315 and the substrate 100. The third gate structure 315 may include a third insulating material film 330 and a third gate electrode 320 sequentially stacked on the second surface 310b of the third oxide semiconductor film 310.

The third gate electrode 320 may include a side wall 320S extending in the thickness direction of the substrate 100.

In the present example embodiment, the third insulating material film 330 is not formed on the side wall 320S of the third gate electrode 320, and the third insulating material film 330 does not extend along the side wall 320S of the third gate electrode 320.

In the semiconductor device according to an example embodiment, the side wall 320S of the third gate electrode 320 and the side wall 310S of the third oxide semiconductor film 310 may be aligned in the thickness direction of the substrate 100.

The third contact 380 may fill the third contact hole 380h. The third contact 380 may be disposed between the third oxide semiconductor film 310 and the substrate 100. The third contact 380 may be disposed on the first surface 310a of the third oxide semiconductor film 310.

The third contact 380 may be connected to the third oxide semiconductor film 310. The third contact 380 may be connected to a transistor including the fourth gate structure 415. The third contact 380 may electrically connect the third oxide semiconductor film 310 and the transistor including the fourth gate structure 415.

Although the third contact 380 is shown as electrically connecting the third oxide semiconductor film 310 and the source/drain region 102, the third contact 380 may be connected to the fourth gate electrode 420.

Further, when a transistor (e.g., a first transistor and a second transistor) including a plurality of fourth gate structures 415 is formed on the substrate 100, one of the third contacts 380 may be connected to the first transistor, and the other one of the third contacts 380 may be connected to the second transistor.

The third contact 380 may be in contact with the third oxide semiconductor film 310. The third contact 380 may include a third contact stud 381 and a third contact oxide film 380a. The third contact oxide film 380a may be disposed at the boundary surface between the third contact 380 and the third oxide semiconductor film 310. For example, the third contact stud 381 may include a transition metal.

The third upper interlayer insulating film 392 may be disposed on the third lower interlayer insulating film 391. The third upper interlayer insulating film 392 may cover the third oxide semiconductor film 310 and the third gate structure 315.

Each of the third lower interlayer insulating film 391 and the third upper interlayer insulating film 392 may include, for example, at least one of silicon oxide, silicon nitride, silicon oxynitride, and a low-dielectric constant material.

Figure 11:
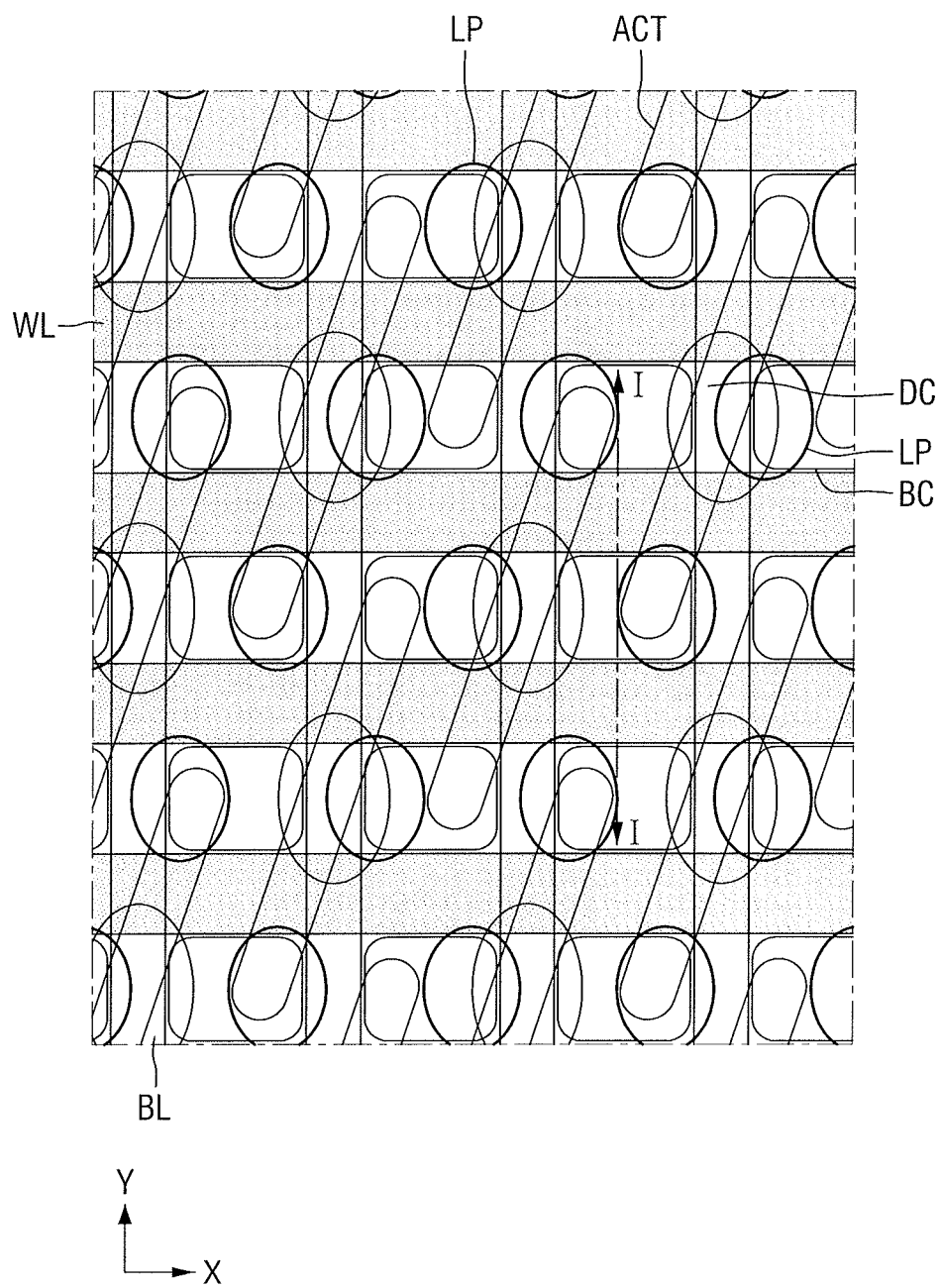
FIG. 11 illustrates a schematic layout diagram of a semiconductor device according to an example embodiment.
Figure 12:
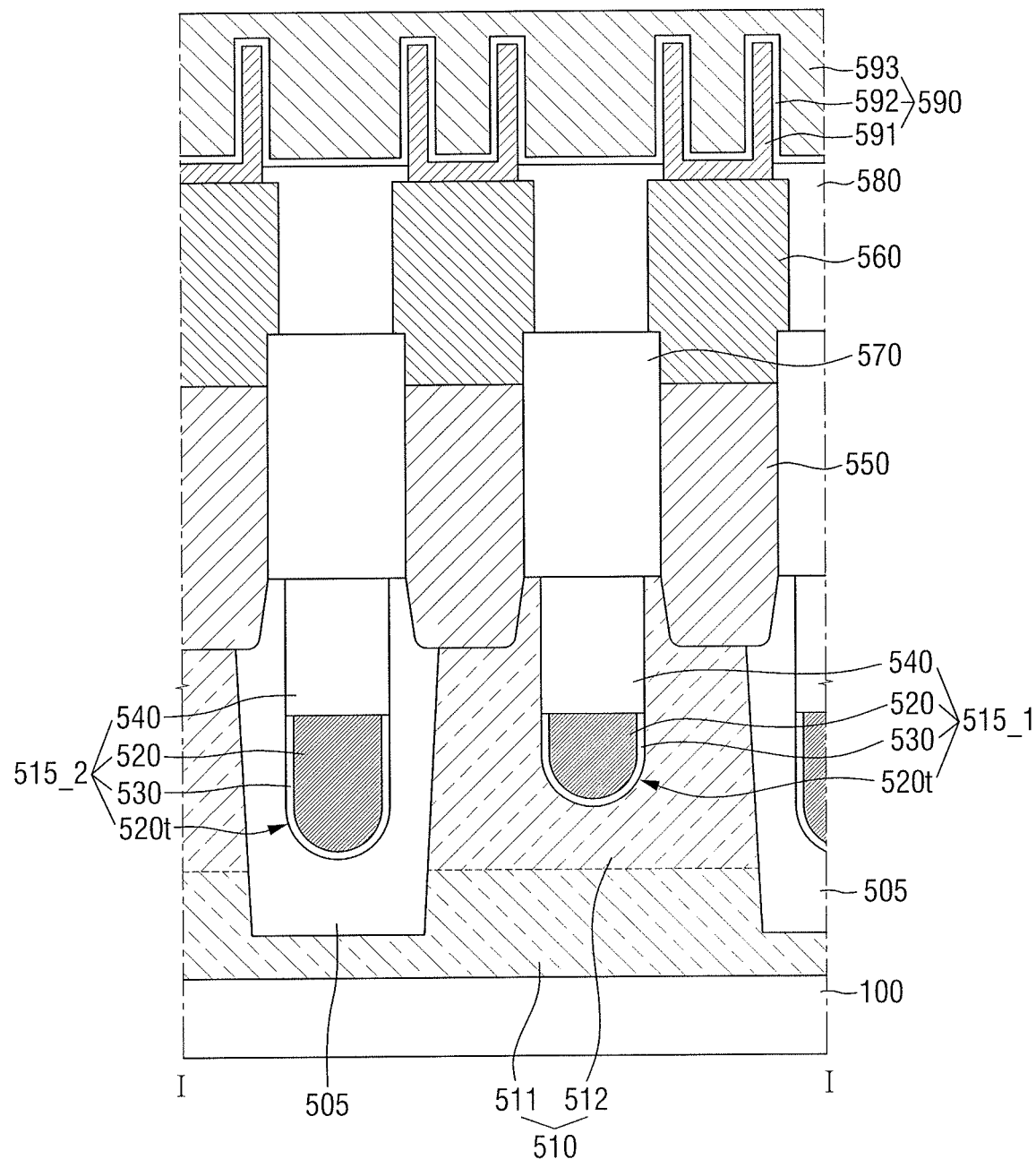
FIG. 12 illustrates a cross-sectional view taken along a line I-I of FIG. 11.

FIG. 11 is a schematic layout diagram of a semiconductor device according to an example embodiment. FIG. 12 is a cross-sectional view taken along the line I-I of FIG. 11.

FIG. 11 shows a DRAM (Dynamic Random Access Memory), but this is merely an example.

Referring to FIG. 11, the semiconductor device according to the present example embodiment may include a plurality of active regions ACT. The active region ACT may be defined by a second element isolation film (505 of FIG. 12) formed in the substrate (100 of FIG. 12).

With a decrease in a design rule of the semiconductor device, the active region ACT may be disposed in a form of a bar of a diagonal line or an oblique line as shown.

A plurality of gate electrodes may be disposed on the active region ACT in the first direction X across the active region ACT. The plurality of gate electrodes may extend in parallel to each other. The plurality of gate electrodes may be, for example, a plurality of word lines WL.

The word lines WL may be disposed at equal intervals. The width of the word line WL or the interval between the word lines WL may be determined depending on the design rule.

A plurality of bit lines BL extending in a second direction Y orthogonal to the word line WL may be disposed on the word line WL. The plurality of bit lines BL may extend in parallel to each other.

The bit lines BL may be disposed at equal intervals. The width of the bit line BL or the interval between the bit lines BL may be determined depending on the design rule.

The semiconductor device according to an example embodiment may include various contact arrays formed on the active region ACT. The various contact arrays may include, for example, a direct contact DC, a buried contact BC, and a landing pad LP.

Here, the direct contact DC may mean a contact that electrically connects the active region ACT to the bit line BL. The buried contact BC may mean a contact that connects the active region ACT to the lower electrode (591 of FIG. 12) of the capacitor.

Due to an arrangement structure, a contact area between the buried contact BC and the active region ACT may be small. Accordingly, a conductive landing pad LP may be introduced to expand the contact area with the active region ACT and increase the contact area with the lower electrode (591 of FIG. 12) of the capacitor.

The landing pad LP may be disposed between the active region ACT and the buried contact BC, and may be disposed between the buried contact BC and the lower electrode of the capacitor. In the semiconductor device according to an example embodiment, the landing pad LP may be disposed between the buried contact BC and the lower electrode of the capacitor. The contact area between the active region ACT and the capacitor lower electrode may decrease by expanding the contact area through introduction of the landing pad LP.

In the semiconductor device according to an example embodiment, the direct contact DC may be disposed in a central portion of the active region ACT. The buried contact BC may be disposed at both end portions of the active region ACT.

As the buried contact BC is disposed at both end portions of the active region ACT, the landing pad LP may be disposed to partially overlap the buried contact BC to be adjacent to both ends of the active region ACT. Thus, the buried contact BC may be formed to overlap an active region ACT between the adjacent word lines WL and the adjacent bit lines BL and the element isolation film (505 of FIG. 12).

The word line WL may be formed as a structure buried in the fourth oxide semiconductor film 510 on the substrate 100. The word line WL may be disposed across the active region ACT between the direct contact DC and the buried contact BC.

As shown in the drawing, two word lines WL may be disposed to cross one active region ACT. As the active region ACT is disposed in the form of the oblique line, the word line WL may have an angle of less than 90 degrees with the active region ACT.

The direct contact DC and the buried contact BC may be disposed symmetrically. Therefore, the direct contact DC and the buried contact BC may be disposed on one line along the first direction X and the second direction Y.

On the other hand, different from the direct contact DC and the buried contact BC, the landing pad LP may be disposed in a zigzag shape in the second direction Y in which the bit line BL extends. Further, the landing pad LP may be disposed to overlap the same side surface portion of each bit line BL in the first direction X in which the word line WL extends.

For example, each landing pad LP of the first line may overlap a left side surface of the corresponding bit line BL, and each landing pad LP of the second line may overlap a right side surface of the corresponding bit line BL.

Referring to FIGS. 11 and 12, the semiconductor device according to the present example embodiment may include a fourth oxide semiconductor film 510, fifth gate structures 515_1 and 515_2, a storage plug 550, and an information storage pattern 590.

The fourth oxide semiconductor film 510 may be disposed on the substrate 100. The fourth oxide semiconductor film 510 may include an amorphous region 511 and a polycrystalline region 512.

The amorphous region 511 of the fourth oxide semiconductor film 510 may be disposed between the substrate 100 and the polycrystalline region 512 of the fourth oxide semiconductor film 510. The polycrystalline region 512 of the fourth oxide semiconductor film 510 may include a C-axis aligned crystal (CA-AC).

The second element isolation film 505 may be formed in the fourth oxide semiconductor film 510. The second element isolation film 505 may have an STI (shallow trench isolation) structure having excellent element isolation characteristics. The second element isolation film 505 may define an active region ACT on the substrate 100.

The active region ACT defined by the second element isolation film 505 may have a long island shape including a short axis and a long axis as shown in FIG. 11. The active region ACT may have the form of the oblique line to have an angle of less than 90 degrees with respect to the word line WL formed in the second element isolation film 505. In addition, the active region ACT may have the form of the oblique line to have an angle of less than 90 degrees with respect to the bit line BL formed on the second element isolation film 505. Thus, the active region ACT may extend in a third direction having a predetermined angle with respect to the first direction X and the second direction Y.

The fifth gate structures 515_1 and 515_2 may be formed in the fourth oxide semiconductor film 510 and the second element isolation film 505. The fifth gate structures 515_1 and 515_2 may be formed across the second element isolation film 505 and the active region ACT defined by the second element isolation film 505.

The fifth gate structures 515_1 and 515_2 include a gate structure 515_1 in the fourth oxide semiconductor film 510 and a gate structure 515_2 in the second element isolation film 505.

The fifth gate structures 515_1 and 515_2 may include a buried gate trench 520t, a fourth insulating material film 530, a fifth gate electrode 520, and a gate block pattern 540 formed in the fourth oxide semiconductor film 510 and the second element isolation film 505. The fifth gate electrode 520 may correspond to the word line WL.

For example, the depth of the buried gate trench 520*t* formed in the fourth oxide semiconductor film 510 may be different from the depth of the buried gate trench 520*t* formed in the second element isolation film 505.

The fourth insulating material film 530 may be used as a gate insulating film. The fourth insulating material film 530 may extend along the side wall and the bottom surface of the buried gate trench 520*t*. The fourth insulating material film 530 may extend along a profile of at least a portion of the buried gate trench 520*t*.

The fifth gate electrode 520 may be formed on the fourth insulating material film 530. The fifth gate electrode 520 may fill a portion of the buried gate trench 520*t*.

The gate block pattern 540 may be formed on the fifth gate electrode 520. The gate block pattern 540 may fill the remaining buried gate trench 520*t* in which the fifth gate electrode 520 is formed. The gate block pattern 540 may include, for example, at least one of silicon nitride (SiN), silicon oxynitride (SiON), silicon oxide ($SiO_2$), silicon carbonitride (SiCN), silicon oxycarbonitride (SiOCN), and combinations thereof.

The fourth lower interlayer insulating film 570 may be disposed on the fourth oxide semiconductor film 510 and the second element isolation film 505. The fourth lower interlayer insulating film 570 may cover the fifth gate structures 515_1 and 515_2.

The storage plug 550 may be formed in the fourth lower interlayer insulating film 570. The storage plug 550 may be connected to the fourth oxide semiconductor film 510.

The storage plug 550 may be disposed on at least one side of the fifth gate structures 515_1 and 515_2. For example, the storage plug 550 may be disposed on both sides of the fifth gate structures 515_1 and 515_2. The storage plug 550 may correspond to the buried contact BC.

The storage plug 550 may include, for example, at least one of an impurity-doped semiconductor material, a conductive silicide compound, a conductive metal nitride, and a metal.

The storage pad 560 may be formed on the storage plug 550. The storage pad 560 may be electrically connected to the storage plug 550. The storage pad 560 may correspond to the landing pad LP.

The storage pad 560 may include, for example, at least one of an impurity-doped semiconductor material, a conductive silicide compound, a conductive metal nitride, and a metal.

A fourth upper interlayer insulating film 580 may be formed on the fourth lower interlayer insulating film 570. The fourth upper interlayer insulating film 580 may be patterned to expose a portion of the upper surface of the storage pad 560.

The information storage pattern 590 may be formed on the storage pad 560. The information storage pattern 590 may be electrically connected to the storage pad 560. Thus, the information storage pattern 590 may be electrically connected to the storage plug 550.

The information storage pattern 590 may include, for example, a capacitor. In the present example embodiment, the information storage pattern 590 includes a lower electrode 591, a capacitor insulating film 592, and an upper electrode 593.

Although the lower electrode 591 is shown to have a cylinder shape, the lower electrode 591 may have, for example, a pillar shape or an "L" shape. In another example embodiment, the lower electrode 591 may have a flat plate shape parallel to the upper surface of the substrate 100.

The capacitor insulating film 592 is formed on the lower electrode 591. The capacitor insulating film 592 may be formed along the profile of the lower electrode 591. The capacitor insulating film 592 may be formed along the outer side wall and the inner side wall of the lower electrode 591.

The upper electrode 593 is formed on the capacitor insulating film 592. The upper electrode 593 may wrap around the outer side wall and the inner side wall of the lower electrode 591.

The lower electrode 591 may include, for example, a doped semiconductor material, a conductive metal nitride (e.g., titanium nitride, tantalum nitride, or tungsten nitride), a metal (e.g., ruthenium, iridium, titanium, or tantalum), and a conductive metal oxide (e.g., an iridium oxide or the like).

The capacitor insulating film 592 may include, for example, one of silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobium, and combinations thereof.

The upper electrode 593 may include, for example, at least one of a doped semiconductor material, a metal, a conductive metal nitride, and a metal silicide.

By way of summation and review, an oxide semiconductor may be used as a channel layer of a transistor.

As described above, embodiments relate to a semiconductor device including an oxide semiconductor film. Embodiments may provide a semiconductor device capable of improving performance and reliability, using an oxide semiconductor film crystallized using a transition metal.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a substrate;
an oxide semiconductor film on the substrate;
a first gate structure on the oxide semiconductor film; and
a contact that is in contact with the oxide semiconductor film, the contact being disposed on a boundary surface with the oxide semiconductor film, and including a metal oxide film that includes a transition metal,
wherein the first gate structure comprises a gate spacer defining a gate trench and extending in a first direction, an insulating material film disposed along sidewalls and a bottom surface of the gate trench, a gate electrode on the insulating material film, and a capping pattern on the gate electrode,
wherein the insulating material film comprises a side portion and a bottom portion, wherein the side portion of the insulating material film contacts the gate spacer, wherein the bottom portion of the insulating material film contacts the gate electrode and the oxide semiconductor film, wherein the gate electrode does not overlap the gate spacer in the first direction, wherein the contact includes a first sidewall and a second sidewall opposite to the first sidewall, and wherein both the first sidewall and the second sidewall are in contact with the oxide semiconductor film.

2. The semiconductor device as claimed in claim 1, wherein the contact includes a portion extending along a side wall of the first gate structure.

3. The semiconductor device as claimed in claim 2, wherein:

the oxide semiconductor film includes a contact trench formed on at least one side of the first gate structure, and a portion of the contact is disposed in the contact trench.

4. The semiconductor device as claimed in claim 3, wherein:

the contact includes a contact liner extending along the side wall of the first gate structure and a side wall of the contact trench, and a contact filling film that fills a liner recess defined by the contact liner, and the contact liner includes the transition metal.

5. The semiconductor device as claimed in claim 2, wherein:

the oxide semiconductor film includes a first surface and a second surface facing away from each other, the first surface of the oxide semiconductor film faces the substrate, and the first gate structure and the contact are disposed on the second surface of the oxide semiconductor film.

6. The semiconductor device as claimed in claim 1, wherein the transition metal includes tantalum.

7. The semiconductor device as claimed in claim 1, wherein the oxide semiconductor film includes a C-axis aligned crystal.

8. A semiconductor device, comprising:

a substrate;

a gate structure on the substrate;

an oxide semiconductor film including a contact trench formed on at least one side of the gate structure between the substrate and the gate structure; and a contact that fills the contact trench, extends along a side wall of the gate structure, and includes a transition metal, wherein:

the contact includes a contact liner extending along the side wall of the gate structure, and a contact filling film that fills a liner recess defined by the contact liner, and a portion of the contact is in contact with the oxide semiconductor film, wherein the gate structure comprises a gate spacer defining a gate trench and extending in a first direction, an insulating material film disposed along sidewalls and a bottom surface of the gate trench, a gate electrode on the insulating material film, and a capping pattern on the gate electrode, wherein the insulating material film comprises a side portion and a bottom portion, wherein the side portion of the insulating material film contacts the gate spacer, wherein the bottom portion of the insulating material film contacts the gate electrode and the oxide semiconductor film, wherein the gate electrode does not overlap the gate spacer in the first direction, and wherein an entire bottom surface of the contact is in contact with the oxide semiconductor film.

9. The semiconductor device as claimed in claim 8, wherein:

the contact liner includes the transition metal, and the contact filling film includes a low-resistance metal having a resistance value lower than that of the transition metal.

10. The semiconductor device as claimed in claim 9, wherein the contact is disposed on a boundary surface with the oxide semiconductor film and includes a metal oxide film including the transition metal.

11. The semiconductor device as claimed in claim 8, further comprising a buffer insulating film disposed between the substrate and the oxide semiconductor film.

* * * * *